United States Patent [19]

Balasubramanian et al.

[11] 4,177,452
[45] Dec. 4, 1979

[54] ELECTRICALLY PROGRAMMABLE LOGIC ARRAY

[75] Inventors: Peruvemba S. Balasubramanian, Manassas, Va.; Stephen B. Greenspan, Boca Raton, Fla.

[73] Assignee: International Business Machines Corporation, Armonk, N.Y.

[21] Appl. No.: 912,682

[22] Filed: Jun. 5, 1978

[51] Int. Cl.² .................... G11C 5/02; G11C 11/40
[52] U.S. Cl. ......................... 340/166 R; 307/238; 365/63; 365/189
[58] Field of Search .............. 340/166 R; 365/63, 94, 365/177, 178, 181, 189, 203, 205, 222; 307/238

[56] References Cited

U.S. PATENT DOCUMENTS

| | | | |
|---|---|---|---|
| 3,560,764 | 2/1971 | McDowell | 307/238 |
| 3,936,812 | 2/1976 | Cox et al. | 365/63 |
| 4,041,459 | 8/1977 | Horninger | 340/166 |
| 4,094,012 | 6/1978 | Perlegos et al. | 365/189 X |
| 4,134,151 | 1/1979 | O'Connell et al. | 365/189 |

Primary Examiner—Donald J. Yusko
Attorney, Agent, or Firm—John E. Hoel

[57] ABSTRACT

A write once, read only electrically programmable storage circuit is disclosed, which employs a flip-flop circuit to store the programmed conductive state of the array device, by means of a blocking transistor connected between the array device and one node of the flip-flop, the control electrode of the blocking transistor being connected to the other node of the flip-flop. With the flip-flop having an initial first state so that the blocking device is conductive, a precharged signal may be conducted through the array device to ground indicating a first stored information state. By driving a write signal through the array device and the blocking device, of sufficient magnitude to set the flip-flop in its opposite state, the blocking device is then made nonconductive and subsequent attempts to transmit a precharge signal through the array device to ground, will not be possible, indicating a second stored information state. This basic storage circuit is inclined as the array cell in a programmable PLA chip architecture which requires only four additional pins beyond the mask programmable version. This is accomplished by the dual use of the output latches of the OR array for both reading out the array and for programming the array by a scan-in technique. Cells in the AND array are programmed by a product term programmer register which allows product terms to be programmed by input partitioning circuits.

7 Claims, 6 Drawing Figures

ELECTRICALLY PROGRAMMABLE LOGIC ARRAY

FIELD OF THE INVENTION

The invention disclosed broadly relates to FET storage circuits, and more particularly, relates to electrically programmable logic array.

BACKGROUND OF THE INVENTION

Performing logic functions in an array of identical circuit elements, each located at a unique intersection of an input and output line in a grid of intersecting input and output lines, is well-known. It is also well-known to perform complex logic functions in a compound arrangement of these arrays called a Programmable Logic Array (PLA) chip by using the outputs of one array as the inputs to another array. U.S. Pat. No. 3,936,812 describes such a PLA on which a number of decoders feed inputs to a first array called a product term generator or an AND array which, in turn, supplies outputs to a second array called a sum of product term generator or an OR array. The outputs of the OR array are then used to control the setting and resetting of a string of latches so that both combinatorial and sequential logic functions can be performed by the PLA. The particular logic functions actually performed by the given PLA are controlled by the locations and number of the active logic circuits in the AND and OR arrays of the PLA and also by how inputs are supplied to the decoders either from off the chip or from the latches.

FIG. 1 illustrates a conventional implementation of a PLA in MOSFET technology where the distinct AND 2 and OR 4 arrays are shown. Inputs to the AND array 2 from the input bit partitioning circuit 8 are on the metal level driving devices 10 in the AND array 2 which are made active by growing thin oxide regions between ground diffusions 11 and product term diffusions 12. Signal outputs from the AND array 2 are transmitted through diffused product term array lines 12. As these product terms enter the OR array 4, they are transformed to the metal level 16 through contacts 14 as shown. The OR array 4 devices 18 are active if a thin oxide region is grown between ground diffusions 19 and output diffusions 20. Outputs from the OR array are on diffused lines 20. Prior art PLA circuits such as this require a relatively large chip area to layout and suffer from an inability to independently test the AND and OR array elements without additional input buffers and output latches. FIG. 1, for clarity, is not optimum since an additional vertical product term line can be placed between ground diffusions for additional density.

Conventional PLA's are programmed by employing a customized photolithographic mask to define thin oxide gate regions for selected ones of a plurality of possible FET array devices. This prior art technique results in PLA products which cannot be subsequently modified to correct errors or to implement logic changes. The mask fabrication process is time consuming and therefore impedes what would otherwise be a rapid LSI logic design technique.

OBJECTS OF THE INVENTION

It is therefore an object of the invention to provide an improved program logic array.

It is still another object of the invention to provide an electrically alterable programmable logic array.

It is still another object of the invention to reduce the turnaround time for implementing changes in a program logic array.

It is still another object of the invention to provide an improved storage circuit.

It is still another object of the invention to provide a dense, electrically, alterable logic array.

It is still another object of the invention to minimize the number of dedicated programming pins in a electrical alterable programmable logic array.

It is still a further object of the invention to make an electrically programmable program logic array device which is compatible with mask programmable logic array devices.

SUMMARY OF THE INVENTION

These and other objects, features and advantages of the invention are accomplished by the electrically programmable PLA invention disclosed herein.

A write once, read only electrically programmable storage circuit is disclosed, which employs a flip-flop circuit to store the programmed conductive state of the array device, by means of a blocking transistor connected between the array device and one node of the flip-flop, the control electrode of the blocking transistor being connected to the other node of the flip-flop. With the flip-flop having an initial first state so that the blocking device is conductive, a precharged signal may be conducted through the array device to ground indicating a first stored information state. By driving a write signal through the array device and the blocking device, of sufficient magnitude to set the flip-flop in its opposite state, the blocking device is then made nonconductive and subsequent attempts to transmit a precharged signal through the array device to ground, will not be possible, indicating a second stored information state. This basic storage circuit is inclined as the array cell in a programmable PLA chip architecture which requires only four additional pins beyond the mask programmable version. This is accomplished by the dual use of the output latches for the OR array for both reading out the array and for programming the array by a scan-in technique. Cells in the AND array are programmed by a product term programmer register which allows product terms to be programmed by input partitioning circuits.

DESCRIPTION OF THE FIGURES

These and other objects, features and advantages of the invention will be more fully appreciated with reference to the accompanying figures.

DISCUSSION OF THE PREFERRED EMBODIMENT

A write once, read only electrically programmable storage circuit is disclosed, which employs a flip-flop circuit to store the programmed conductive state of the array device, by means of a blocking transistor connected between the array device and one node of the flip-flop, the control electrode of the blocking transistor being connected to the other node of the flip-flop. With the flip-flop having an initial first state so that the blocking device is conductive, a precharged signal may be conducted through the array device to ground indicating a first stored information state. By driving a write signal through the array device and the blocking device, of sufficient magnitude to set the flip-flop in its opposite state, the blocking device is than made nonconductive and subsequent attempts to transmit a precharge signal through the array device to ground, will not be possible, indicating a second stored information state. This basic storage circuit is inclined as the array cell in a programmable PLA chip architecture which requires only four additional pins beyond the mask programmable version. This is accomplished by the dual use of the output latches of the OR array for both reading out the array and for programming the array by a scan-in technique. Cells in the AND array are programmed by a product term programmer register which allows product terms to be programmed by input partitioning circuits.

Figure 1:
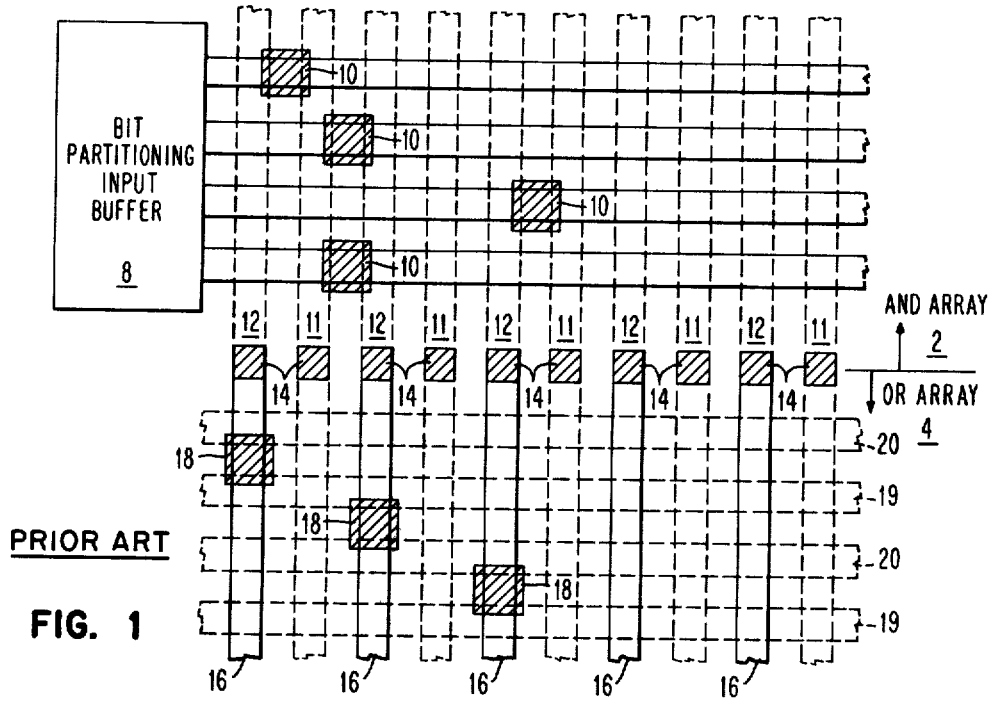
FIG. 1 is a view of the layout of a prior art field effect transistor programmed logic array.
Figure 2A:
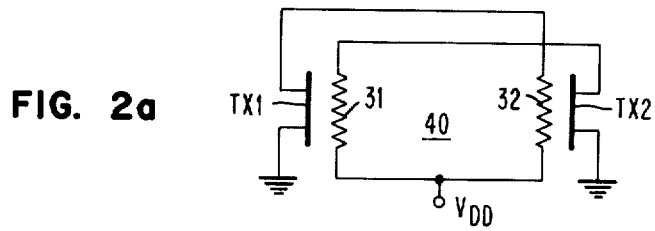
FIG. 2a is a schematic diagram of resistive gate latch cell described in further detail in the copending U.S. patent application, Ser. No. 862,476, filed Apr. 20, 1977, by C. L. Bertin, assigned to the instant assignee.

The referenced copending U.S. patent application to C. L. Bertin describes a very dense latch circuit 40 using resistive gate structures 31 and 32 as shown in FIG. 2a. This disclosure describes the organization of an electrically programmable PLA chip, using the referenced latch cell design.

Figure 2B:
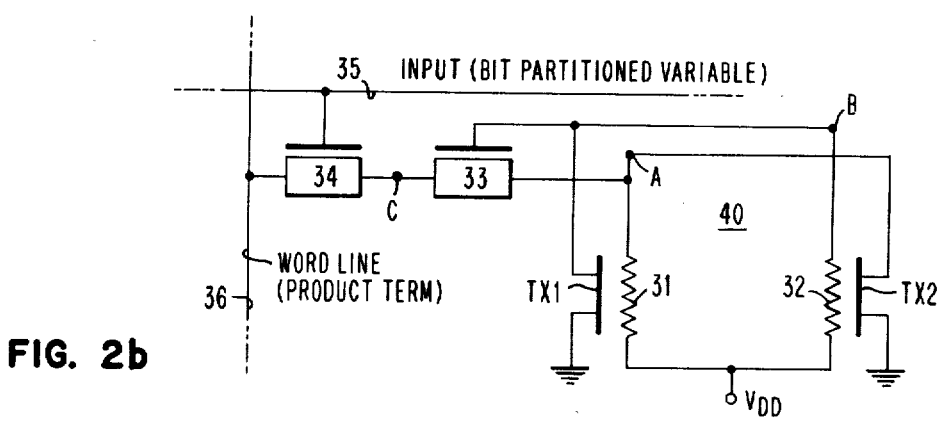
FIG. 2b is a schematic diagram of the programmable PLA cell configuration.

FIG. 2b illustrates the latch cell 40 with the required controls for selecting programming and sensing programming of the cell 40 is as follows: (a) when $V_{DD}$ is turned on, the asymmetric cell design is such that node A is at a "0" state and node B is at a "1" state (i.e., TX2 is conducting and TX1 is nonconducting; (b) selection of this array site is through the input line 35 which is brought to a "1" state; (c) word line 36 is brought to a high positive potential $VD_1$; (d) with word line $36 = VD_1$ and input line 35 at a "1" state, transistor 34 turns on, bringing node C to the potential $\simeq VD_1$; (e) since the gate of transistor 33 has the same potential as node B, transistor 33 is initially turned on when node C rises in potential; (f) since transistors 33 and 34 are on, node A will see a positive potential from the precharged word line 36 (word line $= VD_1$) and the latch cell 40 will change state to node A = "1"; node B = "0"; (g) with node B at "0", device 33 will turn off, isolating the latch 40 from the product term line 36. Hence, this product term/input line intersection will look like a nonpersonalized site. Therefore, the state A = 0, B = 1 corresponds to the condition of a personalized site and the state A = 1 and B = 0 corresponds to the condition of an unpersonalized site.

Figure 5:
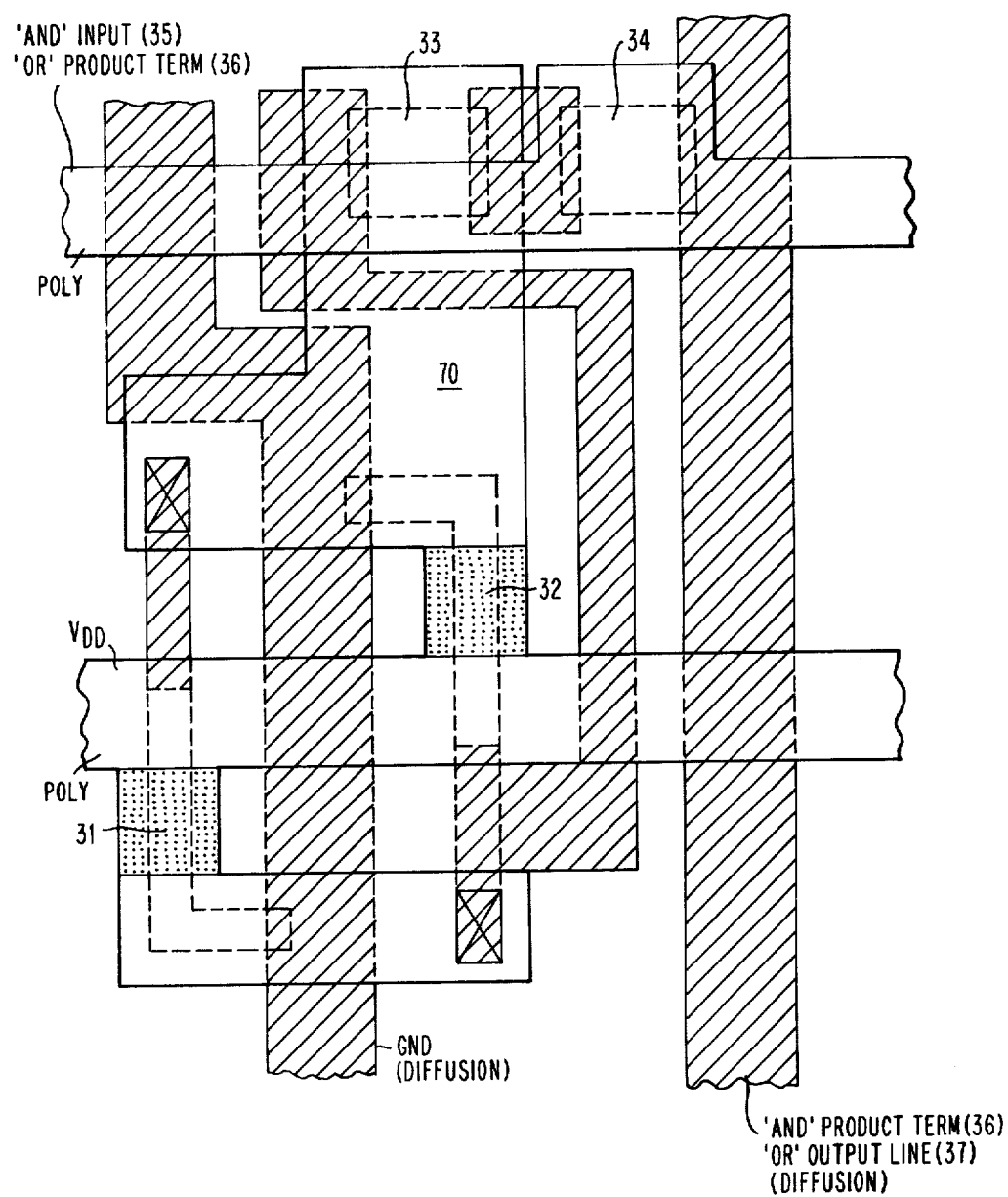
FIG. 5 is a plan view of the layout of the programmable PLA cell configuration, which was shown schematically in FIG. 2b.

The cell configuration 40 is such that the PLA is initialized (when $V_{DD}$ goes to a positive value) to have all sites "personalized" or active. Programming deactivates sites (cells 40) to an equivalent unpersonalized state. FIG. 5 illustrates the layout of array cell of FIG. 2b.

Figure 3:
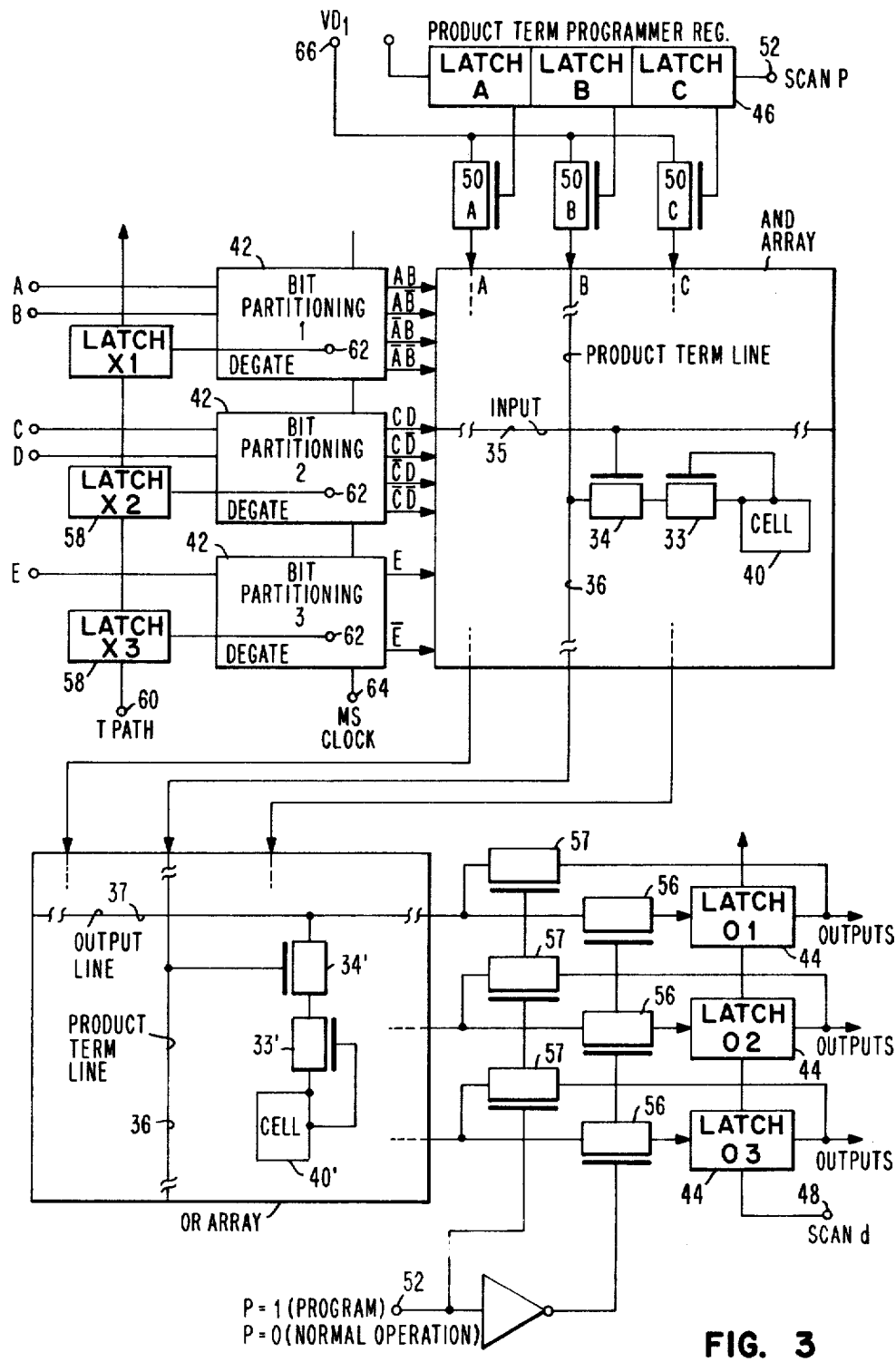
FIG. 3 is a diagram of a PLA chip configuration, employing the programmable PLA cell circuit shown in FIG. 2b.

FIG. 3 illustrates the total programmable PLA chip configuration. Features of this chip are: (a) AND/OR arrays are comprised of dense latch cells 40 and 40', respectively; (b) single and two-bit partitioning circuits 42; (c) output latches 44 01, 44 02, 44 03, on which store OR array outputs for off-chip signals, feedback to bit partitioning inputs 42, or both. These latches 44 are designed with integral scan path (Scan d) 48 for test purposes (i.e., level sensitive scan design - LSSD); (d) for programming, a Product Term Programmer Register 46 (PTPR) controls transfer devices 50 A, 50 B, 50C . . . 50n. When a transfer device 50 is on, the associated product term 36 is tied to $VD_1$ (positive potential). Controlling data into PTPR register 46 is scanned in serially through pin Scan P 52; (e) for programming the OR array cells, devices 57 are activated by signal P 52, and in turn feedback output latch 44 data (1's, 0's) to power up or power down the OR array output lines 37. At the same time, devices 56 are turned off to isolate latch 44 inputs from the output line 37 states. In normal operation, P=0 at terminal 52, keeping devices 57 at off and thereby isolating the latch 44 outputs from the OR array output lines 37. At the same time, devices 56 are on, feeding output line 37 states into the output latches 44; (f) for programming the AND array cells, a register 58 is used to gate the bit partitioning circuit 42 output states. The register 58 is comprised of scannable latches X1, X2 . . . Xn with I/O patterns scanned through pin "T path 60." The gate signal 62 will prevent the bit partitioning circuit outputs from transitioning to a "1" state.

Figure 4:
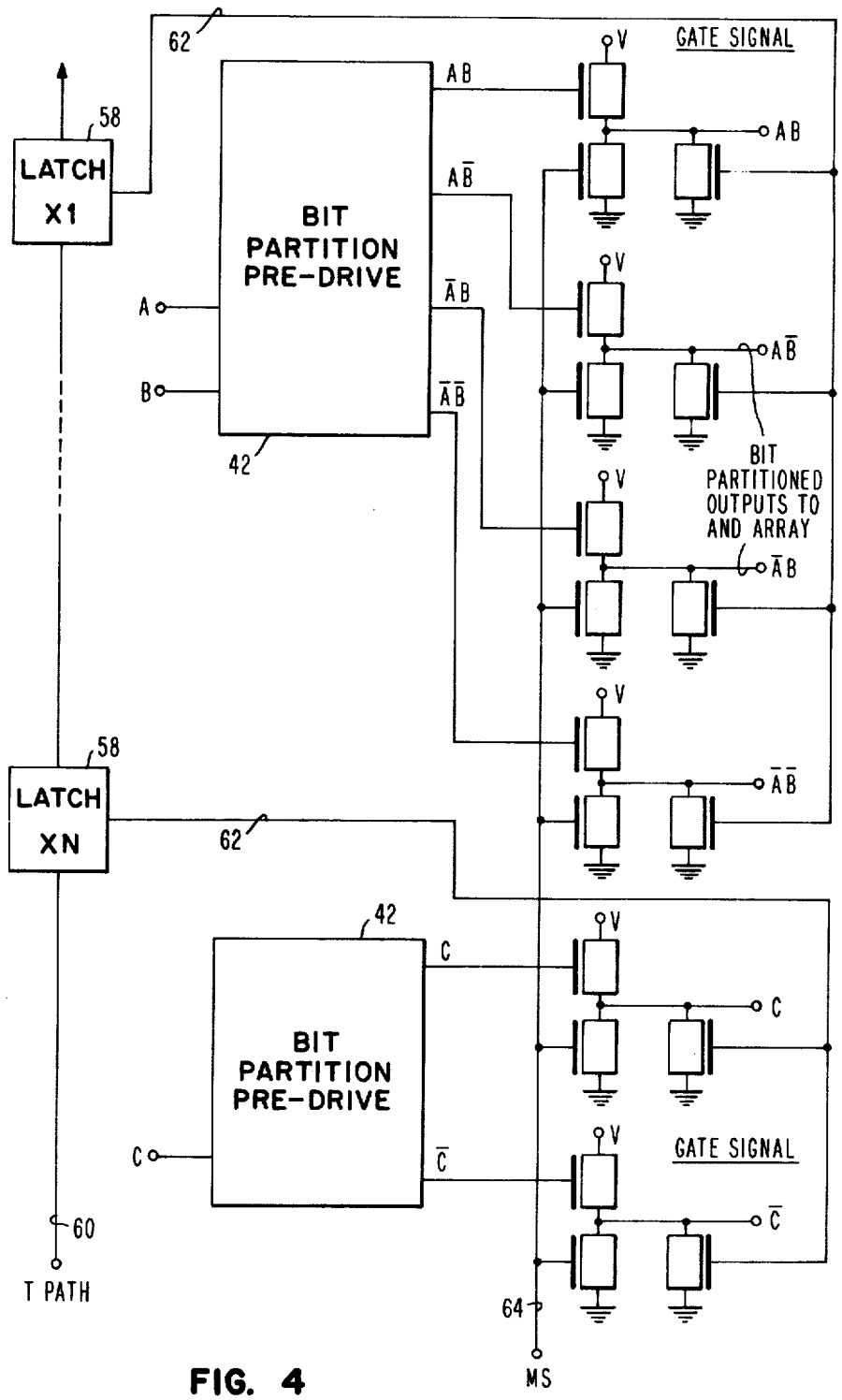
FIG. 4 is a schematic diagram of a bit partitioning gating control circuit.

As shown in FIG. 4, with the gate signal 62 held at a "1" state, all bit partitioning 42 outputs will be held at a "0" state, where the gate signal 62 is determined by the state of individual latches X1, X2 . . . Xn which comprises register 58. This is required to prevent the selection of an unwanted AND array cell site causing the initialized state to change. This will be the case for a given product term 36 not having any activated inputs from a given bit partitioning circuit 42.

Programmable Operation (1) Product term 36 A is brought to potential $VD_1$ through transistor 50 A becoming active by PTPR 46 control of transistor 50 A gate. All other product terms 36 are left floating (transistors 50 B, 50 C=off). The Scan P data stream in this case would have been 100 for PTPR latch stages latch A, latch B and latch C, respectively. (2) With product term 36 at $VD_1$, input variables A, B, etc. are established to provide the correct bit partitioning 42 output states. Each output state equaling 1 will cause that cell site 40 to be selected and flipped (node A from 0 to 1 state within cell 40), causing the selected site to be "deactivated." (3) If, for a given bit partitioning circuit 42, no outputs are desired to be at a "1" state, then that bit partitioning circuit 42 is gated by the gating signal 62 effected by registers 58. (4) While product term 36 A is at $VD_1$, the OR array cells 40' are programmed by setting output lines 37 to "1" or "0" states from the output latch 44, transistor 57 paths. Output line 37 states are established in the corresponding output latch 44, through serial data stream at pin Scan d 48. (5) With product term 36 A at $VD_1$, AND array inputs A, B, etc. are cycled to provide as many "deactivated" cell sites 40 as required for that product term 36 A. (6) The above steps are repeated for product term 36

B, then 36 C ... etc. until all product terms 36 in the AND and OR arrays are programmed.

Normal Operation (a) PTPR register 46 is loaded with 1's to allow product term/word line 36 internal operation. (b) Gating signals 62 are conditioned to allow normal bit partitioned outputs to propagate into the AND array. (c) P=0 at terminal 52.

With the above conditions, the following occurs:

A cycle starts with all word lines 36 precharged to a "1" state. The product terms 36 will be discharged through a cell 40 only if node A in any cell 40 is at a "0" (activated personalized site) potential. If cells 40 have been preprogrammed to an inactive state (where node A=1) the cell 40 is isolated from the product term 36 by device 33.

Reprogramming the PLA (through a digitally controlled programming mechanism ) would require a recycling of the $V_{DD}$ supply to the PLA.

In summary, a programmable PLA is described which requires: (1) four additional pins ($VD_1$ 66, Scan P 52, T path 60, P 53) beyond those required for a mask programmable version. (2) Approximately 20% additional chip area above a mask programmable version. (3) Requires straightforward polysilicon gate processing. Point 1 results in a pluggable equivalent to a mask programmable version. Point 2 results in acceptable costs. Point 3 implies near-term availability.

FIG. 5 shows a layout of the resistive gate FET flip-flop circuit in the electrically programmable PLA. FIG. 5 corresponds to the numbered elements in the circuit diagram of FIG. 2b. The AND input line 35 is a second level polycrystalline silicon or second level metal line and form the gate electrodes for the transistor 34. The polycrystalline silicon layer 70 is a first level conductive layer which forms both nodes A and B of cell 40 in FIG. 2b and is patterned to form the gate electrode for the transistor device 33, the gate electrode 32 for the transistor 2 and the gate electrode 31 for the transistor 1 in the flip-flop circuit. The polycrystalline silicon layer 70 is built to have a higher resistivity to the gate regions 31 and 32, and for the balance of the layer.

The resulting electrically programmable PLA has the capacity to program the array devices in the PLA by selectively forcing the state of the storage devices through the word line for the array, reduces the number of conductor lines necessary to support the programmability feature, provides a pin compatibility design with a mask programmable PLA, and reduces design turn-around time over prior art mask programmable PLA devices. The improved layout for the electrically programmable PLA provides a high density storage capability which enables the concentration of highly complex logical functions into a small chip area, which function can be modified on a real time basis, as needed, thereby, providing an extremely powerful logic design. The layout, as shown in FIG. 5, is compatible with existing FET technology processes, such as combined metal gate, poly gate or double poly gate processes which take advantage of the self-aligned characteristics for the devices to provide a still greater compaction density for the resulting circuits.

While the invention has been particularly shown and described with reference to the preferred embodiment thereof, it will be understood by those skilled in the art that the foregoing and other changes in form and detail may be made therein without departing from the spirit and the scope of the invention.

Having thus described our invention, what we claim as new, and desire to secure by Letters Patent is:

1. A memory circuit, comprising:
    a transistor flip flop circuit having a first active device with its current path connected between a first node and a zero state voltage and a second active device with its current path connected between a second node and said zero state voltage, said first node connected to the control electrode of said second active device and said second node connected to the control electrode of said first active device, with said first device having an initial nonconductive state and said second device having an initial conductive state;
    a blocking transistor device having its current path connected to said second node and its control electrode connected to said first node;
    an array transistor device having its current path connected between the current path of said blocking transistor and a word line and its control electrode connected to a bit line;
    a circuit path from said word line through the current paths of said array device, said blocking device, and said second active device representing a first stored information state, a second information state being represented by an open circuit due to said blocking device being nonconductive;
    said conduction state of said blocking device being controlled by the voltage state of said first node;
    said voltage state at said first node being selectably altered from said first state with said first active device nonconductive to a second state with said first active device conductive, by the transmission of a write voltage signal from said word line through the current paths of said array device and blocking device to said control electrode of said first active device turning it on and thus switching the flip-flop and turning said blocking device off.

2. The circuit of claim 1 wherein said first and second active devices and said blocking and array devices are field effect transistors.

3. The circuit of claim 1 wherein said first and second active devices and said blocking and array devices are bipolar transistors.

4. The circuit of claim 1 wherein said flip-flop circuit is an asymmetric bistable circuit wherein said first active device enters a nonconductive state and said second active device enters a conductive state when operating power is initially applied to said flip-flop circuit.

5. The circuit of claim 1 wherein said flip-flop circuit further comprises:
    an electrode connecting said first node of said flip-flop to an initializing signal source for turning said second active device on and said first active device off at an initialization time.

6. A programmable read only memory architecture, comprising:
    an array of storage cells having rows and columns, each row connected to a respective input line and each column connected to a respective output line, said cells having first and second storage states which are programmable through their respective output lines;
    a plurality of output latches, each having a first input connected to one of said output lines, for storing the stored state of accessed ones of said storage cells in a read mode;

said plurality of output latches each having a second input for storing a programming pulse and having a feedback path connected to each corresponding output line, for transmitting said programming pulse to said selected 1's of said storage cells; whereby said output latch has a second function of programming said storage cells.

7. The programmable read only memory architecture of claim 6, which further comprises:

said latches being connected in master/slave configuration to form a shift register, through which a serial stream of both programming is shifted so as to be aligned with the appropriate output line.

* * * * *